United States Patent [19]

Levy et al.

[11] Patent Number: 4,782,252
[45] Date of Patent: Nov. 1, 1988

[54] OUTPUT CURRENT CONTROL CIRCUIT FOR REDUCING GROUND BOUNCE NOISE

[75] Inventors: Roy J. Levy, Ashland, Oreg.; Steven B. Sidman, Campbell, Calif.

[73] Assignee: Advanced Micro Devices, Inc., Sunnyvale, Calif.

[21] Appl. No.: 130,268

[22] Filed: Dec. 8, 1987

[51] Int. Cl.$^4$ ............... H03K 17/687; H03K 5/00; H03K 17/16
[52] U.S. Cl. ................... 307/576; 307/443; 307/289; 307/572; 307/573; 307/542; 307/546; 307/300
[58] Field of Search ............... 307/572, 573, 576, 579, 307/584, 585, 358, 359, 542, 546, 547, 549, 553, 254, 255, 289, 300, 262, 443, 263

[56] References Cited

U.S. PATENT DOCUMENTS 3,992,650 11/1976 Iwasa et al. .................. 307/289
4,318,011 3/1982 Zeis ............................. 307/359

Primary Examiner—Stanley D. Miller
Assistant Examiner—Trong Quang Phan
Attorney, Agent, or Firm—Davis Chin; Vincent Tortolano

[57] ABSTRACT

An output current control circuit (10) for use with CMOS output buffers so as to reduce significantly ground bounce noise, includes a variable resistance device (28) for limiting the maximum short circuit current in a pull-down transistor (N1) so as to reduce significantly ground bounce noise. A feedback resistor ($R_s$) is used to sense a reference voltage developed at a system ground reference line (30) for controlling the resistance of the variable resistance device (28).

5 Claims, 1 Drawing Sheet

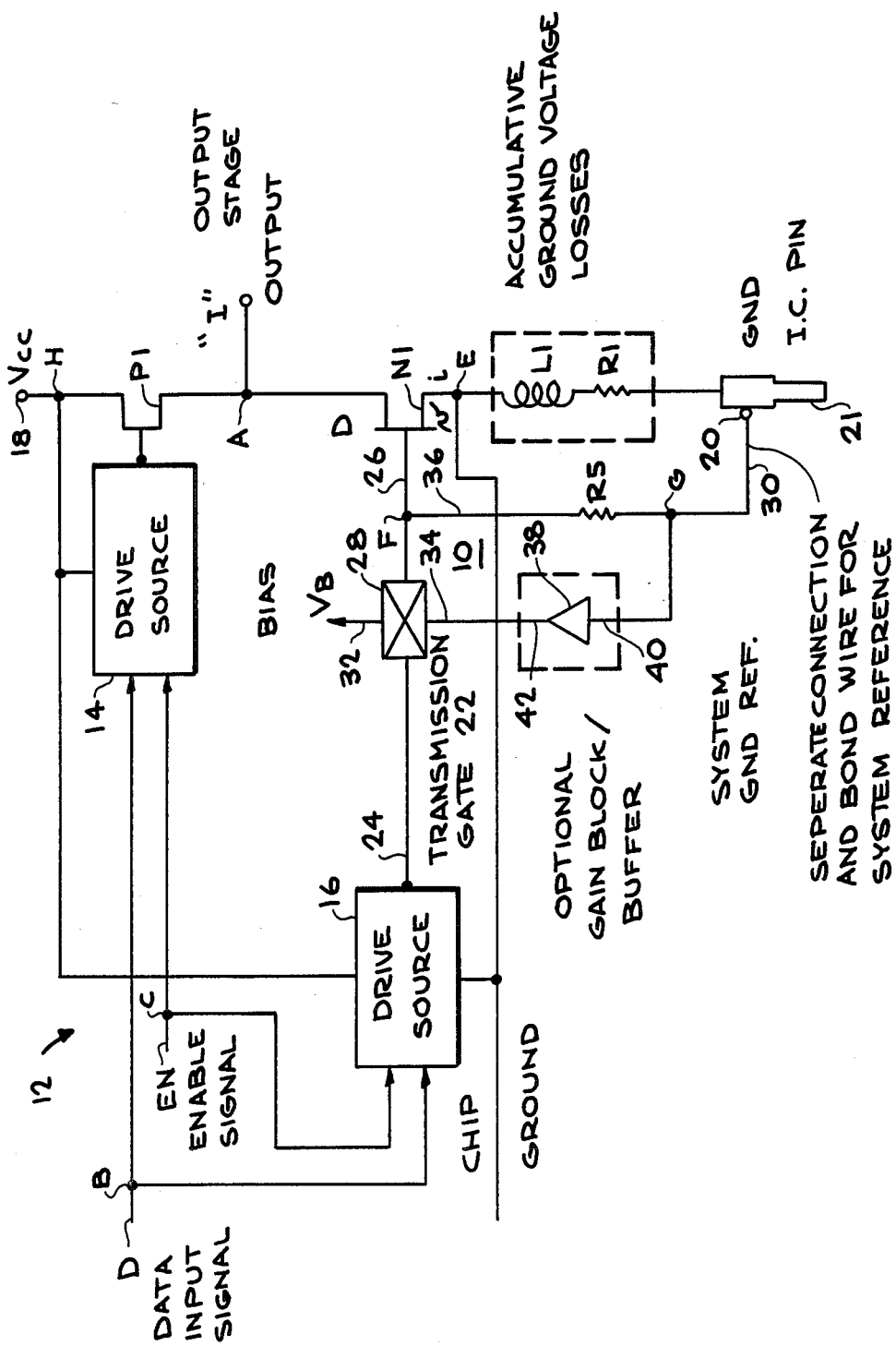

OUTPUT CURRENT CONTROL CIRCUIT FOR REDUCING GROUND BOUNCE NOISE

BACKGROUND OF THE INVENTION

This invention relates generally to complementary metal-oxide-semiconductor (CMOS) output buffer circuits. More particularly, it relates to an output current control circuit for use with CMOS output buffers so as to limit the maximum short circuit current thereof, thereby reducing significantly ground bounce noise.

As is well known, digital logic circuits are widely used in the areas of electronics and computer-type equipment. One such use of digital logic circuits is to provide an interface function between one logic type (i.e., CMOS) of one integrated circuit device and another logic type (i.e., TTL) of another integrated circuit device. An output buffer is an important component for performing this interface function. The output buffer generates, when enabled, an output signal which is a function of a data signal received from other logic circuitry of the integrated circuit.

CMOS output buffer circuit typically use a P-channel pull-up field-effect transistor (FET) and an N-channel pull-down field-effect transistor connected in series between first and second power supply terminals. The first power supply terminal may be supplied with a positive potential which is connected to an internal power supply potential node. The second power supply terminal may be supplied with a ground potential, which is connected to an internal ground potential node. The connection point of the pull-up and pull-down field-effect transistors is further joined to an output terminal.

Dependent upon the logic state of the data input signal and an enable signal, either the pull-up or pull-down field-effect transistor is quickly turned ON and the other one of them is turned OFF. Such rapid switching ON and OFF the pull-up and pull-down field-effect transistors causes sudden surges of current creating what is commonly known as current spikes. These current spikes will flow through the impedance and inductive components of power supply lines so as to cause inductive noise at the internal power supply potential and the internal ground potential nodes of the output buffer. In particular, when the pull-down transistor is quickly turned ON a large instantaneous current cooperates with the line inductance to pull up the internal ground potential which is defined as "ground bounce noise."

There have been attempts made in the prior art at solving this problem of ground bounce noise by driving the pull-down transistor in the output buffer with two different drive sources. One of the drive sources is made to be smaller than the other one and is used to drive ON initially the pull-down transistor. Since this smaller drive source has a smaller current capability, it will tend to slowly turn on the pull-down transistor. Thus, this prior art solution has the disadvantage in that it requires the sacrificing of speed and an increased propagation delay. Then, the larger drive source is used to maintain the pull-down transistor ON so as to provide the needed high current capability. Further, this prior art solution has also the disadvantage of requiring the drive sources to be a function of the load and must be designed for a particular load current.

It would therefore be desirable to provide an output current control circuit for use with CMOS output buffers which reduce significantly ground bounce noise but yet has a high speed of operation and perform independently of the load current. The output current control circuit of the present invention includes a variable resistance device interconnected between a drive source and the gate electrode of the pull-down transistor. The reduction in the ground bounce noise is achieved by increasing the resistance in the variable resistance device in response to a reference voltage generated at the internal ground potential node due to the ground bounce noise. As a result, the maximum short circuit output current in the pull-down transistor is maintained within a certain limit so as to minimize degradation of the propagation delay.

SUMMARY OF THE INVENTION

Accordingly, it is a general object of the present invention to provide an output current control circuit which is relative simple and economical to manufacture and assemble, but yet reduces significantly ground bounce noise in CMOS output buffers.

It is an object of the present invention to provide an output current control circuit for use with CMOS output buffers which limits the maximum output current thereof, thereby reducing significantly ground bounce noise.

It is another object of the present invention to provide an output current control circuit which includes a variable resistance device interconnected between a drive source and the gate electrode of the pull-down transistor for limiting the maximum output current.

It is still another object of the present invention to provide an output current control circuit which includes a transmission gate for varying the resistance between a drive source and the control electrode of the pull-down transistor and a feedback resistor for controlling the resistance of the transmission gate.

In accordance with these aims and objectives, the present invention is concerned with the provision of an output current control circuit for use with a CMOS output buffer for limiting the maximum output current thereof so as to reduce significantly ground bounce noise. The output buffer includes an output stage formed of a pull-up transistor and a pull-down transistor connected together in series. The pull-up transistor has one of its main electrodes coupled to a first external power supply terminal, its other main electrode coupled to an output node, and its gate electrode coupled to the output of a first drive source. The pull-down transistor has one of its main electrodes coupled to a second external power supply terminal, its other main electrode coupled to the output node, and its gate electrode coupled to the output of a second drive source.

The output current control circuit includes a variable resistance device having a control line for varying the resistance between the second drive source and the gate electrode of the pull-down transistor. A feedback resistor is coupled between the gate electrode of the pull-down transistor and a separate system ground reference point connected to the second external power supply terminal for feeding back a reference voltage to the control line of the variable resistance device. As a result, the resistance of the variable resistance device is increased in response to the reference voltage and thus limits the output current in the pull-down transistor, thereby reducing significantly the ground bounce noise.

BRIEF DESCRIPTION OF THE DRAWINGS

These and other objects and advantages of the present invention will become more fully apparent from the following detailed description when read in conjunction with the accompanying drawing in which there is shown a schematic diagram of the output current control circuit for carrying out the current limiting of the instant invention.

DETAILED DESCRIPTION OF THE PREFERRED EMBODIMENT

Referring now in detail to the drawing of the particular illustration, there is shown a schematic circuit diagram of an output current control circuit 10 of the present invention for use with a CMOS output buffer 12 for limiting the maximum short circuit current thereof, thereby reducing significantly ground bounce noise. As is conventional, the CMOS output buffer 12 includes an output stage formed of a P-channel pull-up field-effect transistor (FET) P1 and an N-channel pull-down FET N1 connected together in series. The output buffer 12 provides an output signal at the connection point or output node A of the transistors P1 and N1.

Typically, the gate of the pull-up transistor P1 is coupled to a first drive source 14, and the gate of the pull-down transistor N1 is coupled to a second drive source 16. The two drive sources 14 and 16 are both responsive to a data input signal D received at an input node B and an enable signal EN received an at input node C. Power for all of the components of the output buffer 12 is provided by first external and second external power supply terminals 18, 20. A first supply potential VCC is supplied at the first external power supply terminal 18. A second supply or ground potential GND is applied at the second external power supply terminal 20.

Accordingly, either one of the transistors P1 and N1 is turned ON and the other one is turned OFF in response to the data input signal D when the enable signal EN is activated. Thus, the output node A of the output buffer 12 will take on either a high logic level or a low logic level. The second external power supply terminal 20 is connected to an internal ground potential node E via series-connected resistor R1 and an inductor L1 which represents the impedance and inductance components in the power supply line. The second external power supply terminal 20 is also used to make a physical connection to an integrated circuit ground pin 21 so as to define a "system ground reference" or GND. The internal ground potential node E is connected via a lead line 22 to a pad of the integrated circuit chip so as to define a "chip ground."

As thus far described, the system ground potential at the terminal 20 and the chip ground on the lead line 22 or internal node E will be at the same potential during quiescent or at a steady-state condition. However, when the pull-down transistor N1 is turned ON there will be generated a large instantaneous current "i" at the internal ground potential node E. As a result of the inductance L1, a voltage "v" will be created at the node E which pulls the internal ground potential above the system ground reference at the terminal 20, thereby producing a ground bounce noise.

In order to maintain a limit on the current "i" so as to reduce significantly this unwanted ground bounce noise, there is provided the output current control circuit of the present invention. The output current control circuit 10 is interconnected between the output line 24 from the drive source 16 and the gate lead line 26 of the pull-down transistor N1. The current control circuit 10 includes a transmission gate 28, a reference voltage sensing or feedback resistor $R_S$, and a separate connection lead line 30.

The transmission gate 28 functions as a variable resistance device which varies the resistance between the drive source 16 and the gate of the pull-down transistor N1. The transmission gate 28 has its input connected to the output line 24 of the drive source 16 and has its output connected to the gate lead line 26 of the transistor N1 at a node F. A first control line 32 of the transmission gate is connected to a bias voltage $V_B$, and a second control line 34 is coupled to one end of the feedback resistor $R_S$ and to the separate lead line 30 at node G. The other end of the feedback resistor $R_S$ is connected via line 36 to the node F.

As can thus be seen, the system ground reference at the terminal 20 connected to the integrated circuit pin 21 is further connected by the separate connection lead line 30 to the feedback resistor $R_S$ at the node G. The other end of the resistor $R_S$, as previously stated, is joined to the node F by the line 36. This path just described is generally referred to as a "Kelvin" connection since there is minimal current drain in this path.

Further, an optional gain/buffer 38 may be provided when the second control line 34 requires a higher drive current. As will be noted, if necessary, the buffer 38 has its input on line 40 connected to the node G and has its output on line 42 connected to the second control line 34 of the transmission gate 28.

The operation of the output current control circuit 10 will now be described. When the pull-down transistor N1 is turned ON, the large current "i" will appear at the internal ground potential node E for developing the voltage "v". This voltage "v" will create a voltage drop across the sensing or feedback resistor $R_S$ which is fed back to the second control line 34 of the transmission gate 28. Since the transmission gate is functioning as a variable-resistance device, it forms a controlled resistive divider network with the feedback resistor $R_S$. As a result, the resistance of the transmission gate 28 is caused to be increased. Thus, the drive voltage from the drive source 16 will be decreased so as to control or limit the output short circuit current flowing in the pull-down transistor N1 to an allowable maximum. As a result, data contamination caused by the upward shift in the voltage "v" at the internal ground potential node E with respect to the system ground reference at the terminal 20 will be minimized since the output current "i" has been reduced.

It will be appreciated that this output current control circuit 10 functions independently of the load current "I" at the output node A. It will be also appreciated by those skilled in the art that a similar output current control circuit could be connected between the drive source 14 and the gate electrode of the pull-up transistor P1 so as to reduce output signal ringing at the internal supply potential node H. However, the fluctuations at the node H will be generally smaller than the ones at the node E. Therefore, an output current control circuit to control the current at the node H when the pull-up transistor P1 turns ON may not be required.

From the foregoing detailed description, it can thus be seen that the present invention provides an output current control circuit for limiting the maximum output short circuit current in a CMOS output buffer, thereby reducing significantly ground bounce noise. This performance is achieved by the provision of a variable resistance device for controlling the resistance in response to a reference voltage.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modification may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An output current control circuit for use with a CMOS output buffer for limiting the maximum output current thereof so as to reduce significantly ground bounce noise, said control circuit comprising in combination:
    an output stage formed of a pull-up transistor (P1) and a pull-down transistor (N1) connected together in series;
    said pull-up transistor (P1) having one of its main electrodes coupled to a first external power supply terminal (18), its other main electrode coupled to an output node (A), and its gate electrode connected to the output of a first drive source (14);
    said pull-down transistor (N1) having one of its main electrodes coupled to a second external power supply terminal (20), its other main electrode coupled to the output node (A), and its gate electrode coupled to the output of a second drive source (16);
    variable resistance means having a control line (34) for varying the resistance between said second drive source (16) and the gate electrode of said pull-down transistor (N1); and
    feedback means coupled between the gate electrode of said pull-down transistor (N1) and a separate system ground reference line (30) connected to said second external power supply terminal (20) for feeding back a reference voltage to the control line of said variable resistance means so as to vary the resistance and thus limit the output current,
    whereby the ground bounce noise at an internal ground potential node (E) connected between the source of said pull-down transistor and said second external power supply terminal is significantly reduced.

2. An output control device as claimed in claim 1, wherein said variable resistance means comprises a transmission gate (28) having its input connected to the output of said second drive source (16), its output connected to the gate electrode of said pull-down transistor (N1), and its control line (34) coupled to said feedback means.

3. An output control circuit as claimed in claim 2, wherein said feedback means comprises a resistor ($R_s$) having its one end connected to the output of said variable resistance means and the gate electrode of said pull-down transistor (N1) and its other end coupled to the control line of said variable resistance means and to said separate system ground reference line (30).

4. An output current control circuit as claimed in claim 3, further comprising buffer means (38) interconnected between said resistor ($R_s$) and the control line (34) of said variable resistance means for increasing a current applied thereto.

5. In a CMOS output buffer, the buffer including an output stage formed of a pull-up transistor (P1) and a pull-down transistor (N1) connected in series, the improvement comprising:
    output current control means (10) responsive to a reference voltage developed at a separate system ground reference line (30) for limiting the maximum output current in said pull-down transistor (N1); and
    said output current control means (10) including a feedback resistor ($R_s$) for sensing the reference voltage and a transmission gate (28) responsive to the sensed reference voltage for reducing drive voltage to said pull-down transistor (N1).

* * * * *